United States Patent [19]

Morley et al.

[11] 4,187,505

[45] Feb. 5, 1980

[54] DISPLAY APPARATUS

[75] Inventors: Colin A. Morley, Caterton; Richard N. Thomas, Weybridge; Bela Kollar, Hollington, all of England

[73] Assignee: Smiths Industries Limited, London, England

[21] Appl. No.: 847,386

[22] Filed: Oct. 31, 1977

[30] Foreign Application Priority Data

Oct. 29, 1976 [GB] United Kingdom ............... 45040/76

[51] Int. Cl.$^2$ ............................................. G01D 7/00
[52] U.S. Cl. .................. 340/753; 324/78 D; 340/784; 350/333
[58] Field of Search .................. 340/324 R, 336, 753; 350/332, 333; 315/169 R; 324/78 D

[56] References Cited

U.S. PATENT DOCUMENTS

| 3,922,666 | 11/1975 | Inami et al. ........................ 340/753 |
| 3,978,322 | 8/1976 | Dobkin ............................... 324/78 D |
| 4,040,719 | 8/1977 | Schiebelhuth ..................... 340/324 R |
| 4,060,801 | 11/1977 | Stein et al. ........................ 350/333 |

Primary Examiner—David L. Trafton
Attorney, Agent, or Firm—Pollock, Vande Sande and Priddy

[57] ABSTRACT

Display apparatus for displaying the magnitude of a physical parameter includes a plurality of display regions each of which contains a plurality of electrically-operable display sections. The display apparatus also includes an electric circuit means responsive to an electric signal representative of the said magnitude which is arranged to operate the display sections in a cyclic manner in accordance with that magnitude. To this end, the electric circuit means is arranged, during a first period of each cycle, to effect operation of any display regions in which all sections therein require to be operated and, during a second period of each cycle, to effect appropriate operation of any other display region in which only at least one of the display sections thereof require to be operated.

9 Claims, 4 Drawing Figures

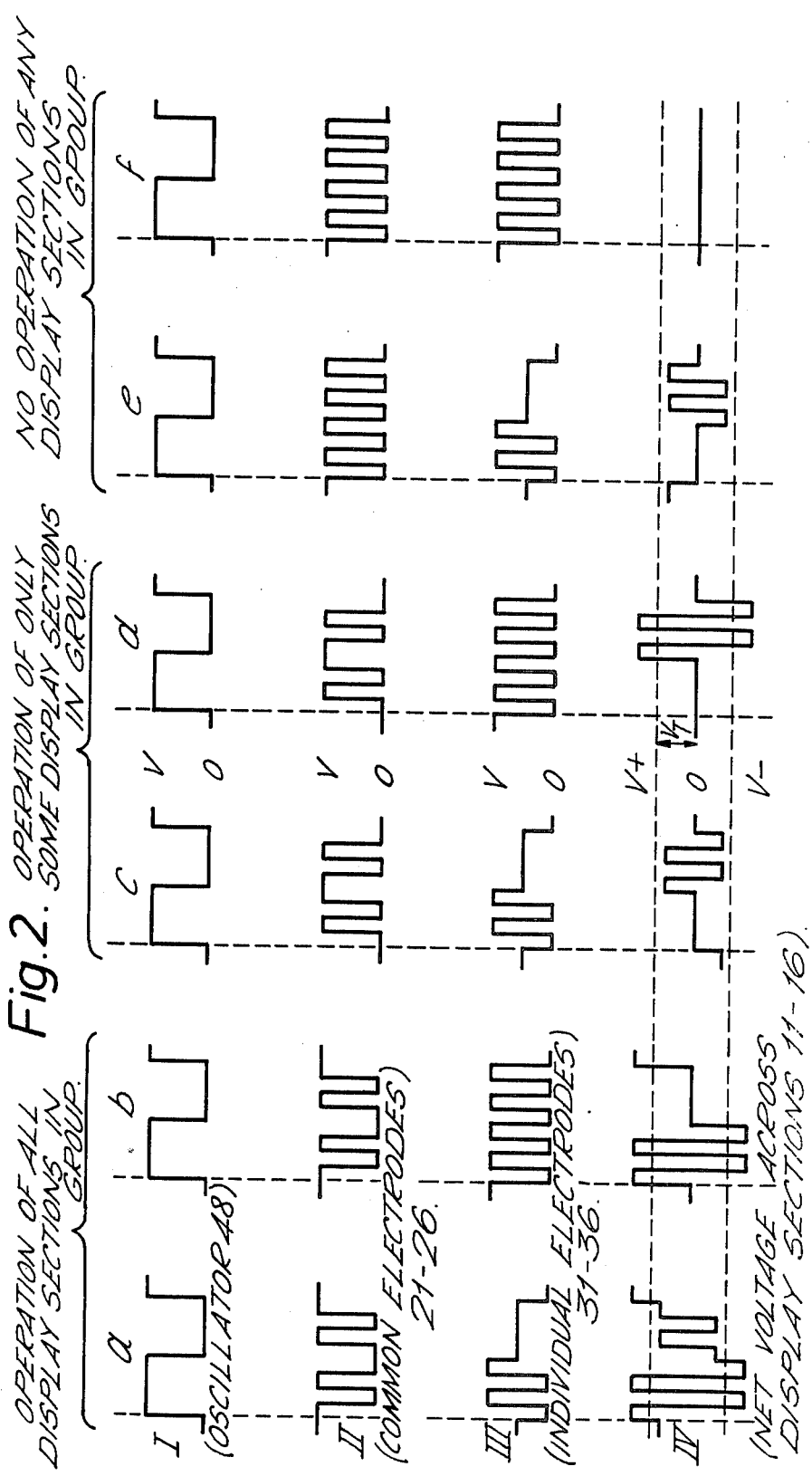

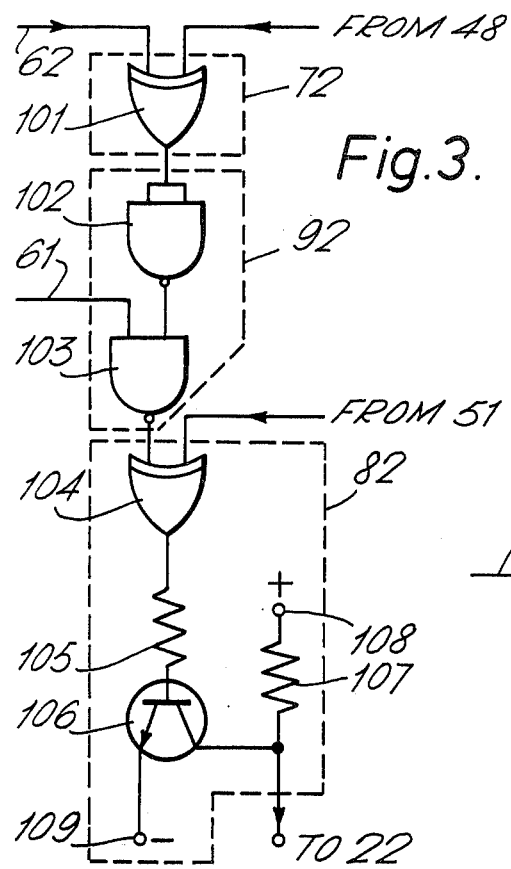
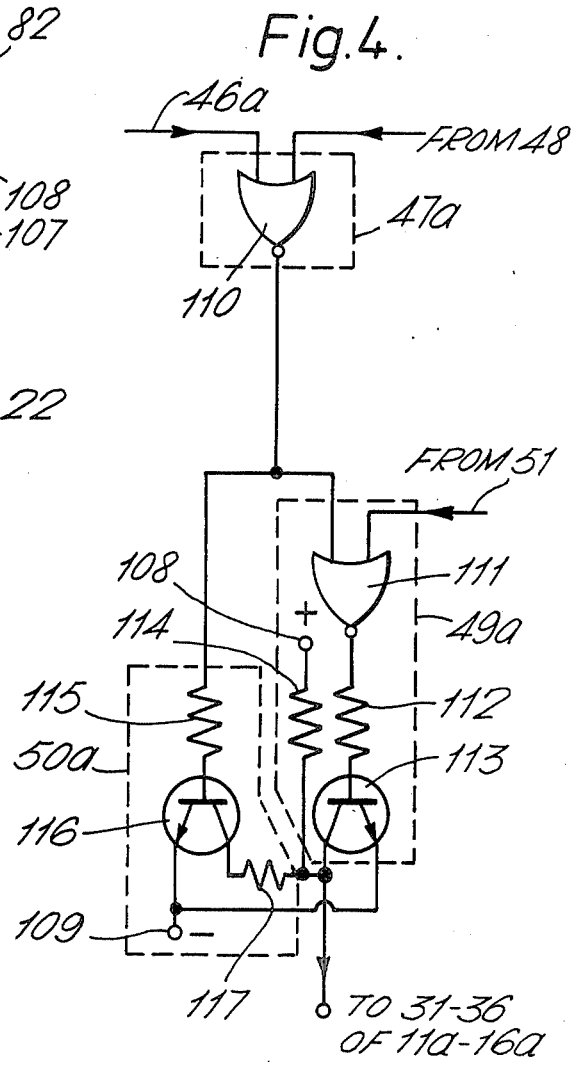

DISPLAY APPARATUS

This invention relates to display apparatus.

According to one aspect of the present invention there is provided display apparatus for displaying the magnitude of a physical parameter by selective operation of a plurality of display regions each of which contains a plurality of electrically-operable display sections, wherein electrical circuit means responsive to an input signal representative of the said magnitude is arranged to operate the display regions appropriate to indication of the said magnitude in a cyclic manner, such that during one period of each cycle the circuit means effects operation of any display region in which all sections therein require to be operated, and during another period in each cycle the circuit means effects appropriate operation of any other display region in which only at least one of the display sections thereof require to be operated.

Preferably each display region comprises a layer of electrically-operable display material, an electrode on one side of the said layer and common to all display sections of that region, and a plurality of electrodes to the other side of the said layer and defining individual and respective ones of the display sections in that region.

The said individual electrodes of each set of display sections, occupying a corresponding position within their respective display sections, may be coupled together to form respective sets of electrodes.

The circuit means may be arranged to generate three signals, namely first and second oscillatory signals of opposite phase to one another, and a third signal, of non-oscillatory form, and selectively to supply these signals to the said electrodes in accordance with the said magnitude to be displayed, the magnitudes of the three signals being selected such that operation of a display section is effected only when the first oscillatory signal is applied to one electrode of that display section and the second oscillatory signal is applied to the other electrode of that display section.

During said one period in each said cycle, the circuit means may supply the first oscillatory signal to all said gets of individual electrodes, said second oscillatory signal to the common electrode of any display region in which all display sections therein require to be operated, and said first oscillatory signal to the common electrode of any remaining display region.

During said another period of each said cycle, the circuit means may supply said first oscillatory signal to the set of individual electrodes of each display section to be operated in any display section in which not all sections require to be operated, said third signal to the remaining set or sets of individual electrodes, said first oscillatory signal to the common electrode of any display region in which either all or no display sections require to be operated, and said second oscillatory signal to the common electrode of any display region in which not all sections require to be operated.

The said input signal indicative of said magnitude may be a pulse signal having a repetition frequency dependent on said magnitude, and the circuit means may be arranged to count the pulses of said input signals during each said cycle.

According to another aspect of the present invention there is provided speed measuring apparatus comprising display apparatus in accordance with said one aspect of the present invention for displaying the measured speed.

Display apparatus in accordance with this invention for use as a vehicle speedometer or tachometer will now be described, by way of example, with reference to the accompanying drawings, in which:

FIG. 2 is a waveform diagram of signals in the circuit of FIG. 1; and

FIGS. 3 and 4 show typical gating circuits forming part of the circuit of FIG. 1.

Figure 1:
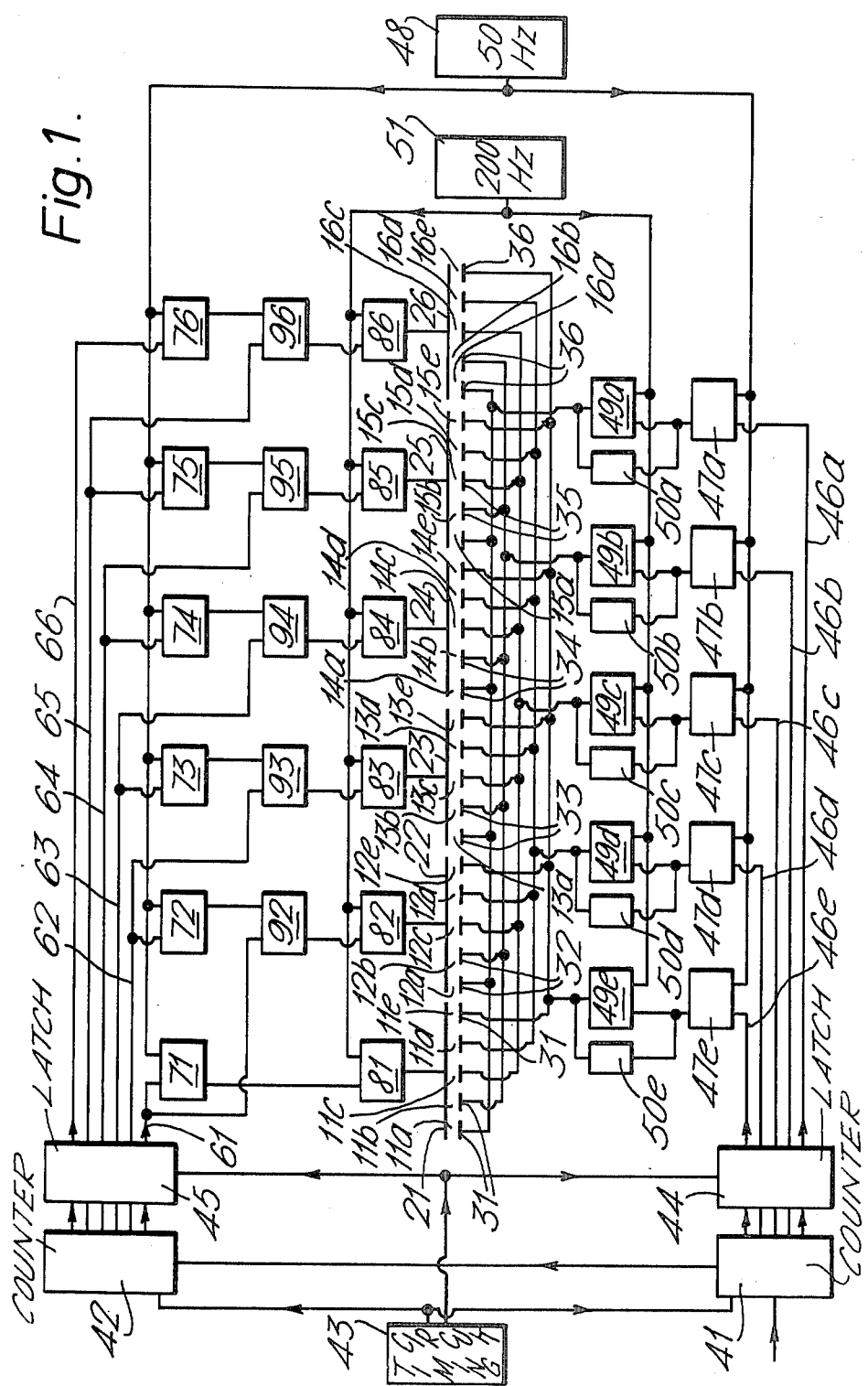
FIG. 1 is a block schematic diagram of the apparatus.

The display apparatus to be described provides a so-called bar-graph representation of the magnitude of a physical parameter, such as vehicle speed or the speed of a vehicle engine. To this end, the apparatus includes a display device having a plurality of sections disposed adjacent one another along a path. The display sections are operated progressively from one end of the path to provide a visible line extending from that end towards the other end through a distance indicative of the magnitude of the parameter.

Referring to FIG. 1, the display sections are disposed along the path (which may be straight, circular or of any other desired configuration) in six groups 11 to 16 each having five sections a to e. The group 11 has an electrode 21 common to all the display sections 11a to 11e, and five electrodes 31 associated with respective ones of the sections 11a to 11e. Each of the other groups 12 to 16 has corresponding and respective common electrodes 22 to 26 and individual and respective groups of electrodes 32 to 36. The common electrodes 11 to 16 may each consist of a single area of contact material, or alternatively of a series of interconnected smaller areas, one for each display section.

Each display section is coupled via its individual electrode to the display sections occupying the corresponding position in the other groups. Thus, for example, the electrode 31 of the display section 11a is coupled to the electrodes 32 to 36 of, respectively, the display sections a of the groups 12 to 16.

In the case of a speedometer or tachometer the parameter whose magnitude is to be indicated by the display device (that is, vehicle or engine speed) is conveniently represented by a pulse-waveform signal having a pulse repetition frequency dependent upon the magnitude of the parameter. This signal is supplied to a five-stage counter 41 which counts the pulses and, after every fifth pulse, supplies a signal to a six-stage counter 42. The counters 41 and 42 are controlled by a timing circuit 43 to count for a predetermined period, at the end of which two latch circuits 44 and 45 are operated by the timing circuit 43 to store the count of the counters 41 and 42 respectively. Thereafter the timing circuit 43 resets the counters 41 and 42, and another counting period commences. The duration of the counting period is chosen having regard to the numerical relationship between the vehicle speed or engine speed and the pulse repetition frequency of the input signal and to the increment of speed represented by each display section, so that, at any given speed, the number of pulses counted is equal to the number of display sections which must be operated to indicate that speed.

During each counting period, the display device is operated in accordance with the result of the previous counting period which is stored in the latch circuits 44 and 45.

The latch circuit 44 has five output lines 46a to 46e, and is arranged to energize an additional one of these lines 46a to 46e, starting with 46a, for each increment of one in the number stored in the latch circuit 44. The lines 46a to 46e are coupled to respective ones of five gates 47a to 47e which also receive a square-wave signal from a 50 Hz oscillator 48. Each gate 47 inverts the square-wave signal when there is no energization of the respective output line 46 of the latch circuit 44, but blocks the square-wave signal (and maintains its output at zero voltage) when that line 46 is energized.

The output of the gate 47a is coupled to one input of a respective gate 49a, the output of which is connected to the individual electrodes 31 to 36 of the intercoupled display sections a of the groups 11 to 16. A switch circuit 50a is connected between the output of the gate 47a and the output of the gate 49a, the second input of which is coupled to the output of a 200 Hz square-wave oscillator 51. The gates 47b to 47e are coupled in the same manner to respective ones of the sets of intercoupled display sections b to e of the groups 11 to 16 via gates 49b to 49e and switch circuits 50b to 50e.

The gates 49 operate in the same way as the gates 47, so that, when the output of any one of the gates 47 is at zero voltage, the square-wave signal from the oscillator 51 is inverted by the respective gate 49. However, when the output of any one of the gates 47 is energized, the respective gate 49 blocks the square-wave signal, and at the same time, the respective switch circuit 50 maintains the output of that gate 49 at a voltage intermediate the maximum and minimum values that the output can attain.

FIG. 2 shows, in line I, the signal from the oscillator 48, and, in line III, the output of a gate 49. Columns a, c and e illustrate the situation when the respective output line 46 of the latch circuit 44 is not energized, and columns b, d and f the situation when the line 46 is energized.

When an output line 46 is not energized, the 50 Hz signal from the oscillator 48 is inverted by the respective gate 47, the output of which is therefore at zero voltage during the first half-cycle of the 50 Hz signal and is energized during the second half-cycle. Thus, during the first half-cycle, the 200 Hz signal is inverted by the respective gate 49 and applied to the individual electrodes 31 to 36 of the respective set of intercoupled display sections a to e. However, in the second half-cycle, these electrodes 31 to 36 receive the steady intermediate voltage supplied by the switch circuit 50—see, for example, line III, column a of FIG. 2.

If an output line 46 is energized, then, during the whole cycle of the 50 Hz signal, the respective gate 47 supplies zero voltage to its gate 49, which therefore continuously applies the inverted 200 Hz signal to the respective set of individual electrodes 31 to 36, as shown in FIG. 2 at line III, column b. Thus, during the first half-cycle of the 50 Hz signal, the gate 49 supplies the inverted 200 Hz signal irrespective of the state of energization of the output line 46. But during the second half-cycle, the gate 49 supplies the 200 Hz signal only when the line 46 is energized.

Referring again to FIG. 1, the latch circuit 45 operates in the same manner as the latch circuit 44 to energize progressively six output lines 61 to 66. Each of these lines 61 to 66 is coupled to one input of a respective one of gates 71 to 76, the other input of which receives the 50 Hz square-wave signal from the oscillator 48. The output of, for example, the gate 71 is coupled to an input of a gate 81 which has another input coupled to the 200 Hz oscillator 51 and its output coupled to the common electrode 21. The common electrodes 22 to 26 are coupled to the outputs of corresponding gates 82 to 86, but these gates are in turn connected to the outputs of the gates 72 to 76 via gates 92 to 96. The gates 92 to 96 are controlled by the energization of the output lines 61 to 65 respectively.

Each of the gates 71 to 76 and 81 to 86 passes the 50 Hz or 200 Hz signal supplied to it, either unchanged when the other input of the gate is at zero voltage, or inverted when the other input is energized. The gate 92 passes the 50 Hz signal from the gate 72 when the line 61 is energized. However, if the line 61 is at zero voltage, the gate 92 blocks the 50 Hz signal, and maintains its output in an energized condition.

Considering first the gates 71 and 81, the 50 Hz signal is applied unchanged to the gate 81 by the gate 71 when the output line 61 is at zero voltage. Consequently, during each first half-cycle of the 50 Hz signal, the 200 Hz signal is inverted by the gate 81 and applied to the common electrode 21. During the second (zero-voltage) half-cycle of the 50 Hz signal, the 200 Hz signal is applied unchanged to the common electrode 21. In FIG. 2, the energization of the common electrodes 21 to 26 is illustrated in line II. Columns c and d illustrate the operation just described.

When the output line 61 is energized, the 50 Hz signal is inverted by the gate 71. Thus the gate 81 applies the 200 Hz signal to the common electrode 21 unchanged during each first half-cycle of the 50 Hz signal, and inverted during each second half-cycle—see FIG. 2, line II, columns a and b.

While the output line 61 is energized, the gate 92 passes the signal from the gate 72 unchanged to the gate 82, and the gates 72 and 82 operate in response to the state of energization of the output line 62 in the same way as the gates 71 and 81 respond to the state of energization of the output line 61. However, when the output line 61 is at zero voltage, the output of the gate 92 is continuously energized, irrespective of the state of the gate 72. Consequently, the gate 82 continuously applies the inverted 200 Hz signal to the common electrode 22, as shown in FIG. 2, line II, columns e and f.

The operation of the gates 73 to 76 and 83 to 86 is similarly affected by the gates 93 to 96 in accordance with the energization of the output lines 62 to 65 respectively.

The display device is based on any of the display technologies, such as the liquid-crystal technology, which exhibit a threshold voltage characteristic in their operation. Thus, when a voltage below the threshold value is applied across a liquid crystal display, the display is not visibly operated. However, if the voltage is increased above the threshold value, the resultant energization causes a visible indication to be provided. The manner in which the energization of the common electrodes 21 to 26 and of the individual electrodes 31 to 36, as described above, effects operation of the display device to provide a visible indication will now be described.

It will be assumed that the display apparatus is a speedometer having a range of 0-60 m.p.h., and that a speed of 34 m.p.h. is to be indicated. Consequently, the first seventeen display sections 11a to 14b must be operated to provide the appropriate indication.

At the end of each counting period determined by the timing circuit 43, the counters 41 and 42 will have counted seventeen pulses, and the latch circuits 44 and 45 energize the output lines 46a and 46b, and 61 to 63 respectively.

Consequently, during each first half-cycle of the 50 Hz signal supplied by the oscillator 48, the energization of the output lines 61 to 63 causes the unchanged 200 Hz signal to be applied to the common electrodes 21 to 23, as explained above (FIG. 2, line II, columns a and b). On the other hand, the common electrodes 24 to 26 have the inverted 200 Hz signal applied thereto, because (in the case of the common electrode 24) the gate 94 is open but the output line 64 is unenergized, (see FIG. 2, line II, columns c and d); and because (in the case of the common electrodes 25 and 26) the gates 95 and 96 are closed (see FIG. 2, line II, columns e and f).

As already noted, all the individual electrodes 31 to 36 always receive the inverted 200 Hz signal during the first half-cycle of the 50 Hz signal (FIG. 2, line II). As a result, the energization of the individual electrodes 31 to 36 is in anti-phase with the energization of the common electrodes 21 to 23, and the display sections 11a to 13e experience a net alternating voltage, as shown in FIG. 2, line IV, columns a and b. The peak amplitude, V volts, of this alternating voltage is arranged to be greater than the threshold voltage, $V_T$ volts, of the liquid crystal display (see FIG. 2, line IV). Thus, these fifteen display sections 11a to 13e provide a visible indication during each first half-cycle of the 50 Hz signal.

However, the energization of the individual electrodes 31 to 36 is in phase with that of the common electrodes 24 to 26, so the display sections 14a to 16e experience no net voltage, and provide no indication, during each first half-cycle of the 50 Hz signal (see FIG. 2, line IV, columns c to f).

It will be seen that during each first half-cycle, an indication is provided only by the display sections a to e in the groups (11 to 13) in which all sections are required to provide an indication, and that this indication is provided irrespective of the selective energization of the output lines 46 of the latch circuit 44.

When the second half-cycle of the 50 Hz signal commences, the common electrodes 21 to 23 begin to receive the inverted 200 Hz signal (FIG. 2, line II, columns a and b), and the common electrode 24 the unchanged 200 Hz signal (FIG. 2, line II, columns c and d). However, the common electrodes 25 and 26 continue to receive the inverted 200 Hz signal (FIG. 2, line II, columns e and f).

At the same time, the individual electrodes 31 to 36 are energized selectively depending upon the state of energization of the output lines 46. Thus, the zero voltage on the output lines 46c to 46e causes the individual electrodes 31 to 36 of the display sections c to e of each of the groups 11 to 16 to receive a steady intermediate voltage (FIG. 2, line III, columns a, c and e). On the other hand, the individual electrodes 31 to 36 of the display sections a and b of each of the groups 11 to 16 are now supplied with the inverted 200 Hz signal by virtue of the energization of the output lines 46a and 46b (FIG. 2, line III, columns b, d and f).

In the first three groups 11 to 13 of display sections, the sections 11a, 11b, 12a, 12b, 13a and 13b experience no net voltage, since both the respective electrodes of each are supplied with the inverted 200 Hz signal (FIG. 2, line IV, column b). The remaining three sections in each of these groups 11 to 13 experience a net alternating voltage of peak value ½ V volts, which is arranged to be less than the threshold voltage $V_T$ of the liquid crystal display (FIG. 2, line IV, column a). Consequently, none of the display sections 11a to 13e provides a visible indication during each second half-cycle of the 50 Hz signal.

The display sections 14a and 14b experience a net alternating voltage of peak value V volts (FIG. 2, line IV, column d), due to the anti-phase energization of their individual electrodes 34 with respect to the energization of their common electrode 24. These two display sections provide a visible indication.

The remaining display sections 14c to 14e of the fourth group 14, and the corresponding sections 15c to 15e and 16c to 16e, experience a net alternating voltage of peak amplitude ½ V volts (FIG. 2, line IV, columns c and e). Since both electrodes of the display sections 15a, 15b, 16a and 16b have the inverted 200 Hz signal applied thereto, these sections experience no net voltage (FIG. 2, line IV, column f). Thus none of these thirteen display sections provides a visible indication.

To summarize, during each second half-cycle of the 50 Hz signal, only the display sections 14a and 14b provide a visible indication. The energization of the output lines 61 to 63 prevents the corresponding sections a and b in the first three groups 11 to 13 of display sections from being operated, and the blocking function of the gates 95 and 96 has the same effect in the fifth and sixth groups 15 and 16.

If, for example, the speed to be indicated fell to 30 m.p.h., the display sections 14a and 14b would no longer need to be operated. The output lines 46a and 46b would not be energized, and a visible indication would be provided by the display device (namely, by the display sections 11a to 13e) only during each first half-cycle of the 50 Hz signal.

It will be noted that the liquid crystal device is subjected either to zero voltage or alternating voltage, thereby avoiding the deleterious effects of d.c. energization.

Although each display section, when operated, is only energized for 10 milliseconds at a time, the pulses of operation recur 50 times a second. Consequently, the persistence of vision of the human eye causes the operated display sections to appear to provide a continuous indication.

It has been found that operating at least some of the display sections simultaneously as described above permits the clarity of the display to be improved in comparison with known systems. In one such known system, the thirty display sections 11a to 16e would be individually and successively operated, as appropriate, during thirty respective time periods in each cycle. Thus, for a cycle-frequency of 50 Hz, one pulse of operation for each display section would be only ⅔ milliseconds in duration. Such a short pulse of operation can result in the liquid-crystal display sections failing to change state completely in response to the energization, leading to an indistinct display. In contrast, in the apparatus of this invention as described above, each display section is operated for a period fifteen times longer than is possible with the known system, thereby giving the display sections adequate time to respond to the energization and provide a clear, distinct display.

By way of example, FIGS. 3 and 4 show, respectively, the gates 72 to 82, and the gates 47a and 49a and the switch 50a in greater detail.

Referring to FIG. 3, the gate 72 comprises an exclusive-OR-gate 101 having two inputs, one coupled to the output line 62 and the other to the 50 Hz oscillator 48. The output of the exclusive-OR-gate 101 is fed via a NAND-gate 102 connected as an inverter to one input of a second, two-input, NAND-gate 103. The NAND-gates 102 and 103 together form the gate 92, the other input of the NAND-gate 103 being coupled to the output line 61. The gate 82 includes a second two-input exclusive-OR-gate 104, one input of which is coupled to the output of the NAND-gate 103, the other input being coupled to the 200 Hz oscillator 51. The output of the exclusive-OR-gate 104 is coupled via a resistor 105 to the base electrode of an n-p-n output transistor 106, the collector electrode of which is connected to the common electrode 22. A resistor 107 couples the collector electrode to a positive power supply point 108, and the emitter electrode is connected to a negative power supply point 109.

The truth table for an exclusive-OR-gate is as follows:

| INPUT A | INPUT B | OUTPUT Q |
|---------|---------|----------|
| L | L | L |
| L | H | H |
| H | L | H |
| H | H | L |

Examination of this table shows that the exclusive-OR-gates 101 and 104 will provide the desired functions of the gates 72 and 82 as described above.

The gates 73 to 76, 83 to 86 and 93 to 96 have the same circuit configuration as the gates 72, 82 and 92. However, there is no gate corresponding to the gates 92 to 96 between the gates 71 and 81. In the case of these two gates, the output of the exclusive-OR-gates comprising the gate 71 is coupled directly to one input of the exclusive-OR-gate in the gate 81.

As shown in FIG. 4, the gate 47a comprises a two-input NOR-gate 110 the inputs of which are connected to, respectively, the output line 46a and the oscillator 48. The output of the NOR-gate 110 is connected to one input of a two-input NOR-gate 111 in the gate 49a. The other input of this NOR-gate 111 is connected to the oscillator 51, and its output is coupled by a resistor 112 to the base electrode of an n-p-n transistor 113. The collector electrode of the transistor 113 is coupled by a resistor 114 to the positive power supply point 108, and directly to the individual electrodes 31 to 36 of the display sections 11a, 12a, 13a, 14a, 15a and 16a, while the emitter electrode is connected to the negative power supply point 109.

The output of the NOR-gate 110 is also coupled, via a resistor 115, to the base electrode of an n-p-n transistor 116 in the switch circuit 50a. The collector electrode of the transistor 116 is coupled via a resistor 117 to the collector electrode of the transistor 113, and the emitter electrode of the transistor 116 is connected to the negative power supply point 109.

The gates 46b to 46e and 49b to 49e, and the switch circuits 50b to 50e have the same circuit configuration as the gates 46a and 49a and the switch circuit 50a.

Although the invention has been described with reference to a speedometer or tachometer, many other parameters may be indicated using apparatus according to the invention. For example, if it is desired to indicate the magnitude of a voltage, the timing circuit 43 and the counters 41 and 42 could be replaced by an analogue-to-digital converter responsive to the voltage.

Furthermore, the invention may be used with an electroluminescent display, for example, rather than a liquid crystal display. In such circumstances, the relatively long period of operation of each display section enables a bright, clear display to be provided with currents of lower magnitude than those required by known systems in which the display sections are sequentially operated and thus energized for shorter periods.

We claim:

1. Display apparatus for displaying the magnitude of a physical parameter, comprising a plurality of electrically-operable display regions each of which contains a plurality of electrically-operable display sections, means for supplying an electric signal representative of the said magnitude, and electric circuit means responsive to the said electric signal to operate the said display sections in a cyclic manner in accordance with the electric signal to provide a representation of the said magnitude, each said cycle of operation of the display regions having first and second periods, the said electric circuit means include first means operable during the said first period of each cycle to effect operation of any said display region in which all display sections therein require to be operated, and second means operable during said second period of each cycle to effect operation of any said display region in which one of the display sections thereof requires to be operated.

2. Display apparatus according to claim 1, wherein the said first period of each cycle precedes the said second period thereof.

3. Display apparatus according to claim 1, wherein each said display region comprises a layer of electrically-operable display material, an electrode to one side of the said layer and common to all said sections of that display region, and a plurality of electrodes to the other side of the said layer and defining individual and respective ones of the display sections of that region.

4. Display apparatus according to claim 3, wherein the individual electrodes of each said set of display sections, occupying a corresponding position within their respective display sections, are coupled together to form respective sets of electrodes.

5. Display apparatus according to claim 4, wherein the said electric circuit means includes means to generate three signals constituting first and second oscillatory signals of opposite phase to one another, and a third signal, of non-oscillatory form, and selectively to supply those signals to the said electrodes in accordance with the said magnitude to be displayed, the magnitudes of the said three signals being selected such that operation of a said display section is effected only when the said first oscillatory signal is applied to one said electrode of that display section and the said second oscillatory signal is applied to the other said electrode of that display section.

6. Display apparatus according to claim 4, wherein the said electric circuit means includes means to generate three signals constituting first and second oscillatory signals of opposite phase to one another, and a third signal of non-oscillatory form, and means operable during said first period of each said cycle to supply said first oscillatory signal to all said sets of individual electrodes, said second oscillatory signal to the said common electrode of any display region in which all display sections therein require to be operated, and said first oscillatory signal to the common electrode of any remaining display region.

7. Display apparatus according to claim 4, wherein the said electric circuit means includes means to generate three signals constituting first and second oscillatory signals of opposite phase to one another, and a third signal of non-oscillatory form, and means operable during said second period of each cycle to supply said first oscillatory signal to the said set of individual electrodes of each display section to be operated in any display section in which not all sections require to be operated, said third signal to the remaining individual electrodes, said first oscillatory signal to the common electrode of any display region in which either all or no display sections require to be operated, and said second oscillatory signal to the common electrode of any display region in which not all sections require to be operated.

8. Display apparatus according to claim 1, wherein the said electric signal representative of said magnitude is a pulse signal having a repetition frequency dependent on said magnitude, and the electric circuit means includes means to count said pulses during each said cycle.

9. Display apparatus according to claim 1, wherein the said display regions are arranged in a line.

* * * * *